United States Patent
Houghton et al.

(10) Patent No.: US 6,629,291 B1
(45) Date of Patent: Sep. 30, 2003

(54) INTEGRATED POWER SOLUTION FOR SYSTEM ON CHIP APPLICATIONS

(75) Inventors: Russell J. Houghton, Essex Jucntion, VT (US); Joni C. Hsu, Fishkill, NY (US); Louis L. Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 09/668,977

(22) Filed: Sep. 25, 2000

(51) Int. Cl.[7] ............................................. G06F 17/50
(52) U.S. Cl. ........................................................ 716/1
(58) Field of Search ............................................ 716/1

(56) References Cited

U.S. PATENT DOCUMENTS

| | | | |
|---|---|---|---|
| 5,063,304 A | * 11/1991 | Iyengar | 323/303 |
| 5,300,824 A | * 4/1994 | Iyengar | 327/540 |
| 5,777,462 A | * 7/1998 | Yue | 323/284 |
| 5,966,045 A | * 10/1999 | Asakura | 327/540 |
| 6,205,079 B1 | * 3/2001 | Namekawa | 327/536 |
| 6,313,695 B1 | * 11/2001 | Ooishi et al. | 326/82 |
| 6,366,506 B1 | * 4/2002 | Mizuno et al. | 365/189.09 |

OTHER PUBLICATIONS

"DC–DC Converters Deliver Better Performance for Distributed Power", by David Morrison, Electronic Design, Jun. 12, 2000, pp. 99–118.

* cited by examiner

Primary Examiner—Matthew Smith
Assistant Examiner—Andrea Liu
(74) Attorney, Agent, or Firm—Scully, Scott, Murphy & Presser; Robert M. Trepp, Esq.

(57) ABSTRACT

A centralized power supply system for a multi-system on chip device includes: an external power supply for supplying power to the device; a centralized DC generator macro having generator components for receiving the external power supplied and generating therefrom one or more power supply voltages for use by surrounding system macros provided on the multi-system chip, the centralized DC generator macro further distributing the generated power supply voltages to respective system macros. A noise blocking structure is provided that surrounds the centralized DC generator system and isolates the centralized DC generator system from the surrounding system macros.

19 Claims, 7 Drawing Sheets

INTEGRATED POWER SOLUTION FOR SYSTEM ON CHIP APPLICATIONS

BACKGROUND OF THE INVENTION

1. Field of the Invention

This invention relates generally to integrated circuits generally, and more specifically, to a system and method for designing and providing an integrated power solution to meet the low-power demand of system on chip (or SOC) designs.

2. Discussion of the Prior Art

The driving forces behind the system on chip integration are the constant striving for smaller package area, lower system power and lower product cost. Especially for the handheld products, for example, cell phones, pagers, global positioning systems (GPS), personal digital assistance (PDAs), laptops and palm computers are all heading in that direction. In other words, a system which used to be built on a board with a package containing several chips, bulky, short battery life, now due to SOC design, becomes a single chip package operated at low-power. Depending on the advancement of the technology, material, design tools, and testing and characterization techniques, the degree of integration, only becomes more and more sophisticated.

For example, in a conventional DRAM chip, for example, an on-chip DC generator system is necessary in order to provide many different voltage levels to effectively achieve DRAM performance. These include a Vpp pump system to provide Ivpp current for a boosted wordline operation to enhance DRAM access time; a Vbb pump system to bias the body of the transfer devices of the memory array so that the sub-threshold leakage of the cell is minimized; a Vwll pump system to hold al the unselected wordlines to a level below ground, so that the sub-threshold leakage of the array devices can be suppressed, also used to improve cell retention time. Also, in the DC generator system, there are many other voltage supplies, for example, Vbgr, a bandgap reference voltage, which is a constant voltage level insensitive to the supply voltage and temperature is used to provide reference for other circuit components; a Vrefdc voltage level varies with the supply voltage can be used for generators so that generated voltage level will vary proportional to the supply voltage; and Vcmn is a constant current reference can be used to bias certain differential amplifiers, etc.

Currently, these complicated systems comprise power system designs implementing off-chip discrete power supplies, or on-chip scattered dc supplies. In short, the DC generator system designed and fabricated in a DRAM chip is a mini-model of an integrated power supply system, which eliminates the need of providing several different voltage levels from external sources.

It is obvious that such an on-chip power supply has many advantages over the off-chip supply. For example, reduced IR drop on the supply voltages, quicker response time and thus less voltage ringing/rippling effect, power saving, etc. More importantly, no discrete power supplies are needed for each macro which means lower system cost, and better reliability. Not only DRAM has an on-chip generator system, Flash memory, microprocessor, and other semiconductor chips are all equipped with similar on-chip generators. Therefore, when placing system, or multi-macros on a chip, the most obvious approach will be each macro carries its own generator block. However, the drawbacks of this approach are: 1) the distributed DC generator (inside each macro) is not an area and power efficient design; for example, in a CPU macro, its internal supply voltage of 1.8V can also be shared for other macros, such as DRAM, SRAM, Flash memory, etc.; 2) the distributed DC generator design is less reliable. Any generator inside the macro must be kept in a good working condition. That is, in the event one of them failed to work, the whole chip may not function properly; 3) the distributed DC power system offers less design flexibility; for example, in a Flash memory, a high positive (or negative) voltage supply is needed for programming (or erasing) purposes. The conventional design obviously implements a multiple stage pump to raise the voltage from an externally provided power supply. This multiple stage pump is bulky and is used for, one purpose, either programming or erasing data to/from flash memory. However, as the flash memory is predominantly used for read operations, this pump remains mostly idle; 4) noise immunity in the distributed DC design is compromised as isolation structures must be provided for all active DC power circuitry (e.g., oscillators, charge pumps, switch capacitors); and 5) provision of the DC power system in the DRAM and Flash memory macro compromises memory array efficiency which is defined as the ratio of memory array size over the total macro size. If DC block is removed from DRAM and Flash memory macro, the array efficiency will naturally be improved.

In view of the aforementioned drawbacks, it would be highly desirable to provide a centralized, integrated power solution for low-power, low-cost and high performance multi-system on chip (SOC) designs.

It would additionally be highly desirable to provide a reliable SOC DC power supply design solution that is flexible, achieves greater chip area reduction and is power and area efficient for meeting the low-power and low cost demand of system on chip designs.

SUMMARY OF THE INVENTION

It is an object of the present invention to provide a centralized high power and area efficient DC generator system for a multi-system chip (or system-on-chip, or SOC).

It is a further object of the present invention to provide a centralized high power and area efficient DC generator system in a strategic area of an SOC that includes a noise blocking structure surrounding all DC generator components which are located in that strategic area.

It is another object of the present invention to provide a centralized high power and area efficient DC generator system design for a SOC that implements sharing of a DC unit by macros so that power demand is optimized at the system level rather than from each individual macro level.

It is still another object of the present invention to provide a centralized high power and area efficient DC generator system design for a SOC such that, during power on, each DC generator syb-system is activated in a sequential way to avoid undesirable stress on the devices, and a possibility of latch-up situation.

According to the principles of the invention there is provided a centralized power supply system for a multi-system on chip device comprising: an external power supply for supplying power to the device; a centralized DC generator macro having generator components for receiving the external power supplied and generating therefrom one or more power supply voltages for use by surrounding system macros provided on the multi-system chip, the centralized DC generator macro further distributing the generated power supply voltages to respective system macros. An effective noise blocking structure is provided that surrounds the centralized DC generator system and isolates the centralized DC generator system from the surrounding system macros.

As it is important that the accuracy of power supply levels for normal operations is ensured, the centralized high power and area efficient DC generator system design for a SOC may include an intelligent built-in-self-test (or BIST) circuit to perform a power-on test on the DC generator system to ensure each internal power supply level is established in the right sequence and with the targeted voltage supply value, and that its current supply capacity is within the specification. The BIST circuit is additionally able to conduct certain levels of repair by performing minor adjustments to or replacing a defective DC power supply component.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS

Figure 1:
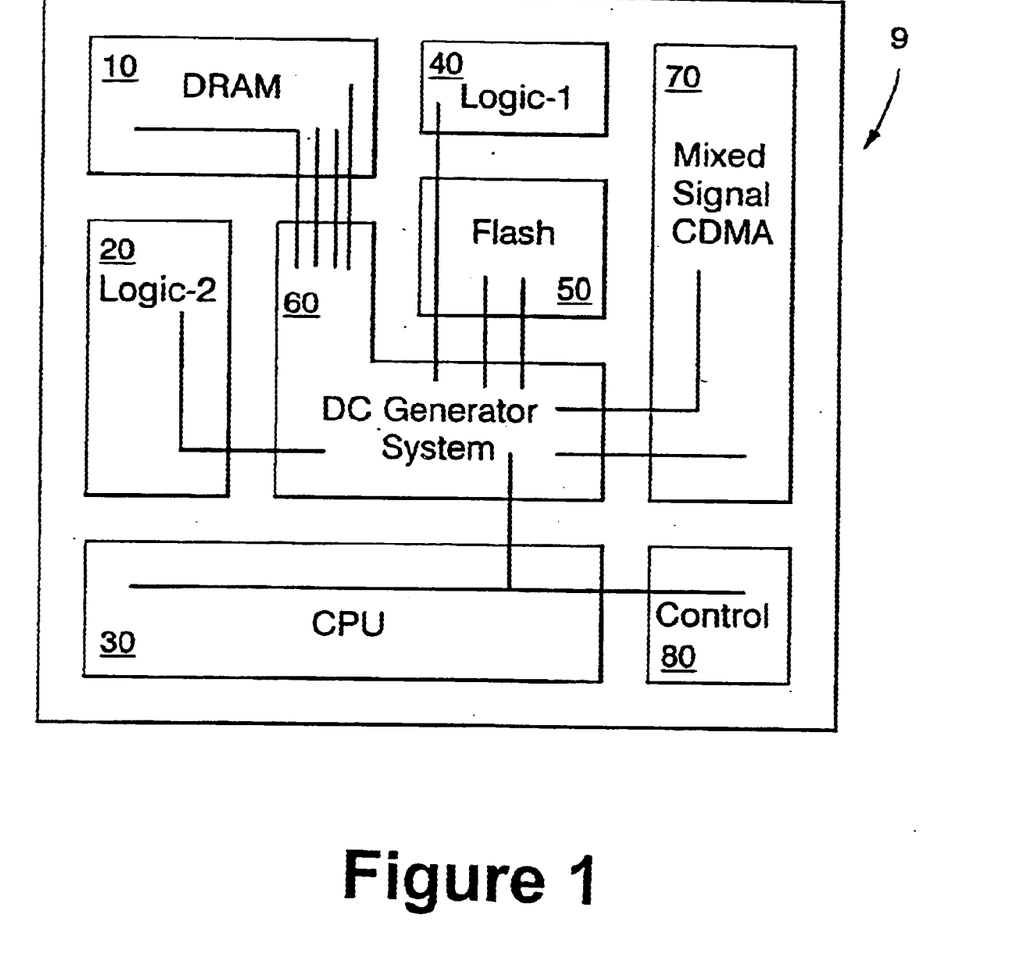
FIG. 1 illustrates the centralized DC power supply system 60 of the invention shown implemented within an SOC chip 9.

FIG. 1 illustrates the centralized DC power supply system 60 of the invention shown implemented within an SOC chip 9. In the example depiction of FIG. 1, a SOC chip 9 comprises a Flash memory macro 50, a DRAM macro 10, a CPU macro 30, and a mixed signal (e.g., code division multiple access or CDMA) macro 70. Additionally included in the example SOC 9 are logic macros, such as Logic-1 macro 40 and Logic-2 macro 20, and one control logic system macro 80. The centralized DC generator system 60 is shown located at the center of the SOC 9 for providing the necessary power supplies and references to itself and all the surrounding macros on the chip.

Figure 2:
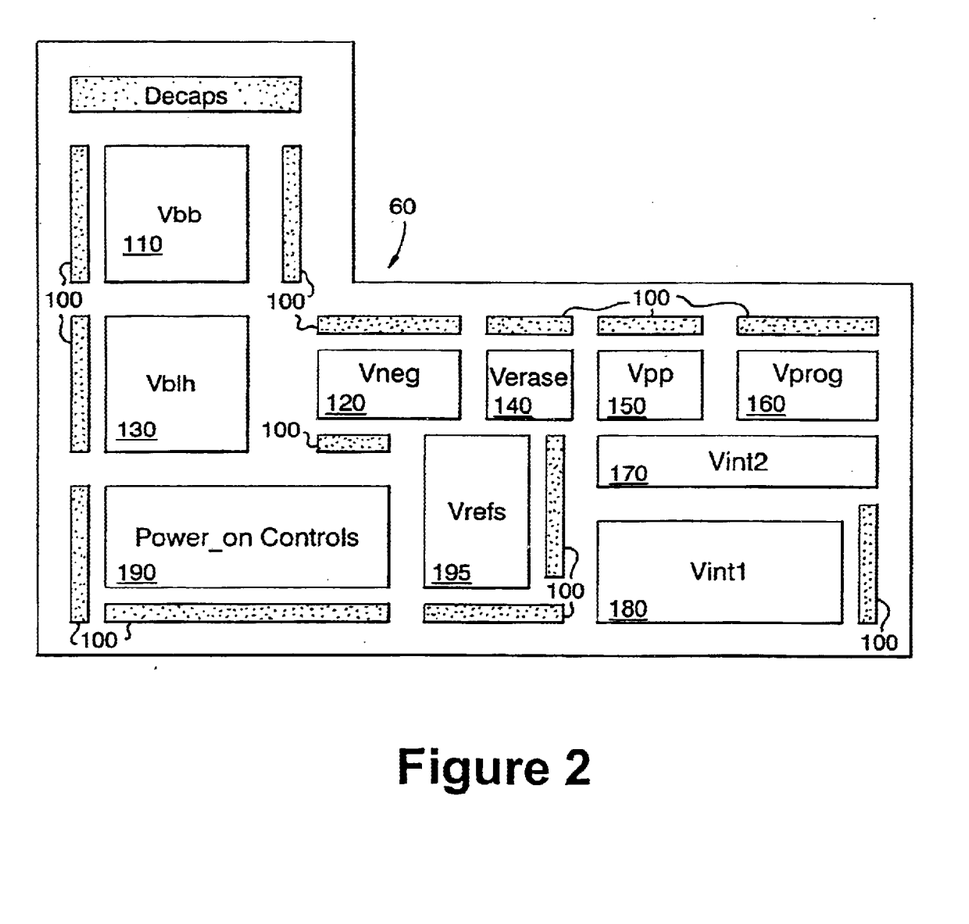
FIG. 2 illustrates in greater detail the DC components comprising the DC generator system 60 of the invention.

FIG. 2 illustrates in greater detail the DC components comprising the DC generator system 60 of the invention. As shown in FIG. 2, the DC components include a plurality of decoupling capacitors 100 which are provided for each of the major generators in the system. Preferably, to save area, deep-trench capacitors are used to build such decoupling capacitors, however it is understood that gate-oxide type capacitors may be implemented. It is understood that more decoupling capacitors may be provided near or inside each corresponding macro. For example, for a DRAM macro, the following DC generators are provided: a Vbb generator 110, a Vneg (Vwll) generator 120, and, a Vpp generator 150. A Vblh generator 130 may also be provided if the bitline voltage level is designed to be different from the voltage level generated by an internal voltage generator Vint1 180 which is the first internal voltage level (e.g., Vint1=1.8V), and the most common voltage level needed by almost all the macros.

In the preferred embodiment, the DC generator system 60 uses the Vint1 180 voltage to generate the other voltage levels, including, but not limited to: the entire CPU macro, the support area (i.e., area other than the memory array) of the Flash and DRAM macros, the digital portion of the mixed signal macro, and at least one logic macro may use this voltage level. As the Vint1 generator 180 powers many of the macros, there is preferably provided a backup unit (not shown). As the Vint1 generator system may comprise many small modules, e.g., ten modules, then another eight or ten modules may be needed as the backup. The system is designed such that any of the backup modules may be activated to replace any of the main modules when it is retired. Another internal voltage Vint2 (e.g., Vint2=2.5V) generator 170 is provided in the event a macro may need to have a higher voltage supply. For example, an analog logic macro 20 (logic-2, macro), or the analog part of the mixed signal CDMA macro 70 in FIG. 1, may run more efficiently with a higher voltage supply. It is additionally more efficient to run Vpp or other high voltage pumps from the Vint2 supply.

For the Flash memory 50, other than the 1.8V supply in support area, the memory array may need a high positive voltage, e.g., 8V for programming, and a high negative voltage level, e.g., -7V for erasure. Therefore, in the DC generator system 60 illustrated in FIG. 2, there is further provided a Vprog generator 160, and a Verase generator 140. A backup unit may be provided from other generators, such as Vpp, Vneg and Vint2 depending on usage and thus, the lifetime of each pump. Further depicted in FIG. 2 shown is a power-on control unit 190 that is provided to guide the power on operation controlled by a BIST (not shown).

Figure 3:
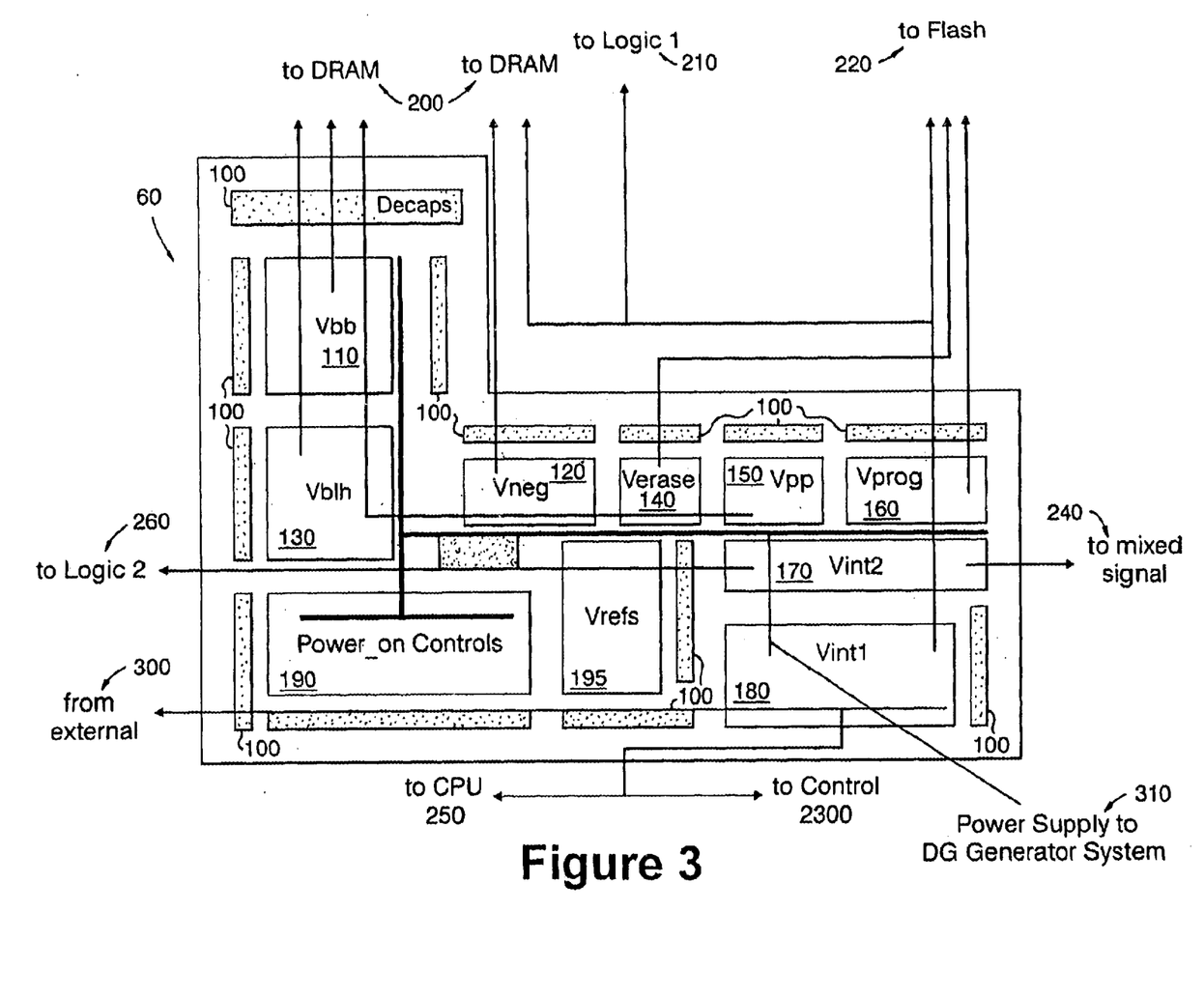
FIG. 3 illustrates the DC generator macro including receipt of the power supply from an external source 300, and supply of multiple generated voltages to different macros.

FIG. 3 illustrates the DC generator macro including receipt of the power supply from an external source 300. A power network that includes Vint1 310 inside the DC generator system is also shown in FIG. 3. The Vint1 is needed for almost all the DC components. Preferably, Vint1 is used to generate 2.5V for Vint2, and -0.5V for the Vbb, etc. It is also used to generate all the reference voltages. A first group of power supply voltages including Vint1, Vbb, Vneg, Vpp and Vblh is fed into the DRAM macro 200. A second group of power supply voltages including Vint1, Verase, Vprog is fed into the Flash memory macro 220; a third group of power supplies including Vint1 and Vint2 is fed into the mixed signal macro 240; a Vint2 supply 260 is fed to logic-2 macro and an analog logic macro; and, Vint1 is fed to logic-1 210 and CPU 250.

According to the preferred embodiment of the invention, a built-in-self-test (or BIST) circuit to perform a power-on test on the DC generator system to ensure each internal power supply level is established in the right sequence and with the targeted value, and, that its current supply capacity is within the specification. The BIST additionally verifies each reference voltage level is correct, as designed. If any of these levels is incorrect, the BIST according to its algorithm, will perform a self-repair operation, either to discard the bad component and replace it with the redundant one, or trim the R/C components so that the level is calibrated. After that, the power-on sequence of the SOC generator is completed. For a system on-chip, such an intelligent BIST is important to ensure the accuracy of power supply levels before the system is on for normal operations.

Figure 6:
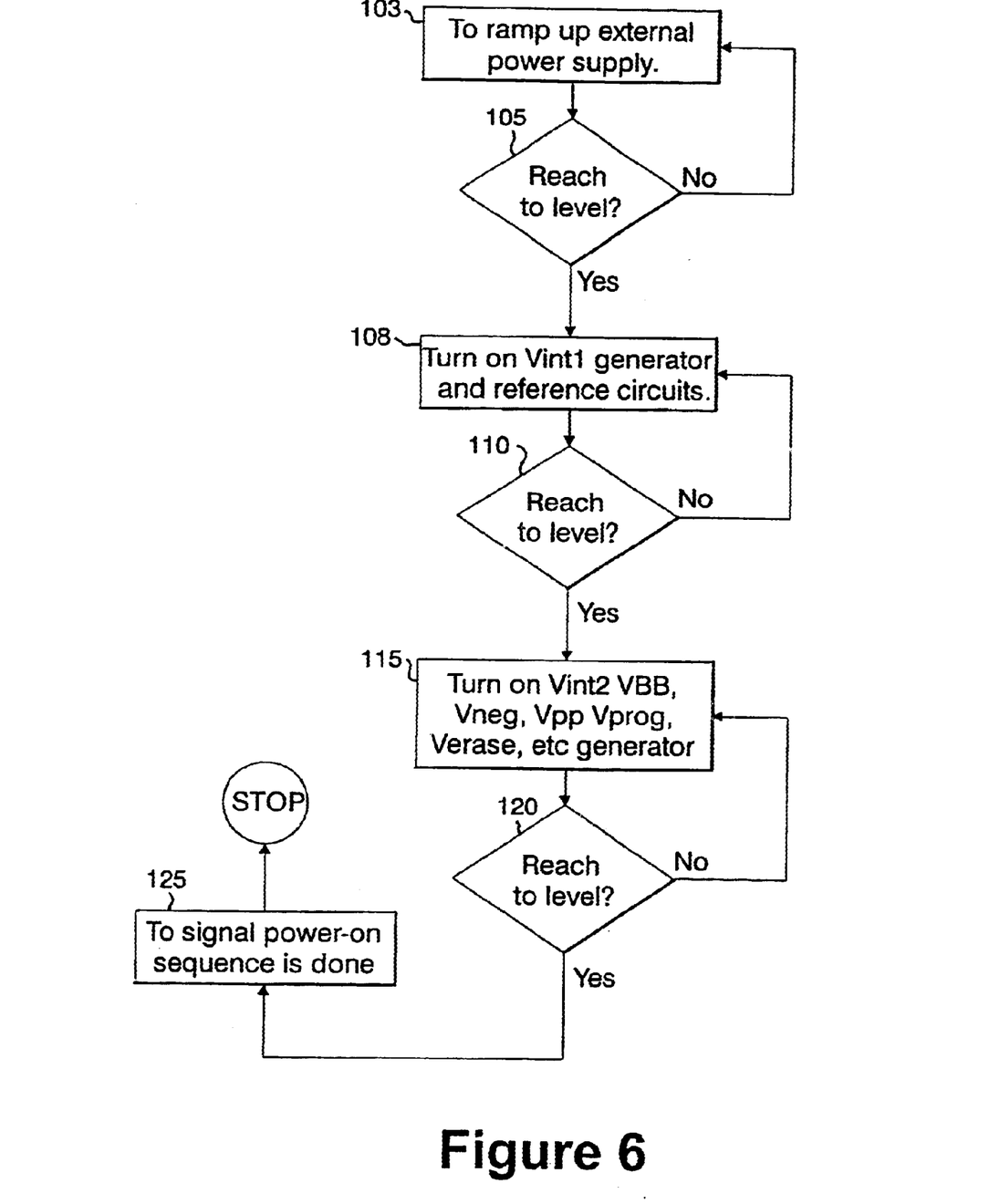
FIG. 6 illustrates a power-on sequence flow diagram according to the preferred embodiment of the invention.

FIG. 6 illustrates a power-on sequence flow diagram 100 performed by the BIST according to the preferred embodiment of the invention. In the power-on sequence flow diagram 100 of FIG. 6, there is provided a first step 103 which requires activating the external power supply and enabling that external supply to ramp to its target level as depicted at step 105. Once the proper external power supply voltage level is reached, the next step 108 is to activate the first internal voltage generator Vint1 which provides the most common voltage level needed by almost all the macros and reference circuits. The power-on sequence waits until the Vint1 supply is ramped to its target level as depicted at step 110. At step 110, once the Vint1 generator has reached its target level, then the power-on sequence continues at step 115 with the activation of the Vint2, Vbb, Vneg, Verase, etc. generators, and enabling these supplies to ramp to their target levels as depicted at step 120. Once these generators have ramped to their target levels, the power-on sequence is completed and an appropriate signal is generated at step 125 to indicate successful power-on and that the system is ready for active operation. It should be understood that, if the power-on sequence is stuck at a certain stage, for example, one of the supplies does not reach its target level, the BIST engine is enabled to perform a checking and repairing process.

As mentioned, the centralized DC system 60 offers more design flexibility for an SOC. That is in order to generate a higher voltage supply, advantage may be taken of the other existing supplies which have a voltage level higher than the externally supply voltage. That is, in the centralized DC system, the generator design may be optimized for the highest power and area efficiency. For example, if the external supply voltage is 2.0V, then it may be pumped up to 3.0V for use as the Vpp supply for the DRAM. Likewise, the generated Vpp supply may be further pumped up to 5V for fuse programming, and, from there, the voltage may be pumped up to 8V for Flash memory programming application, and so on. The given example may apply to any other possible combination to generate high positive or negative, voltages.

Figure 4:
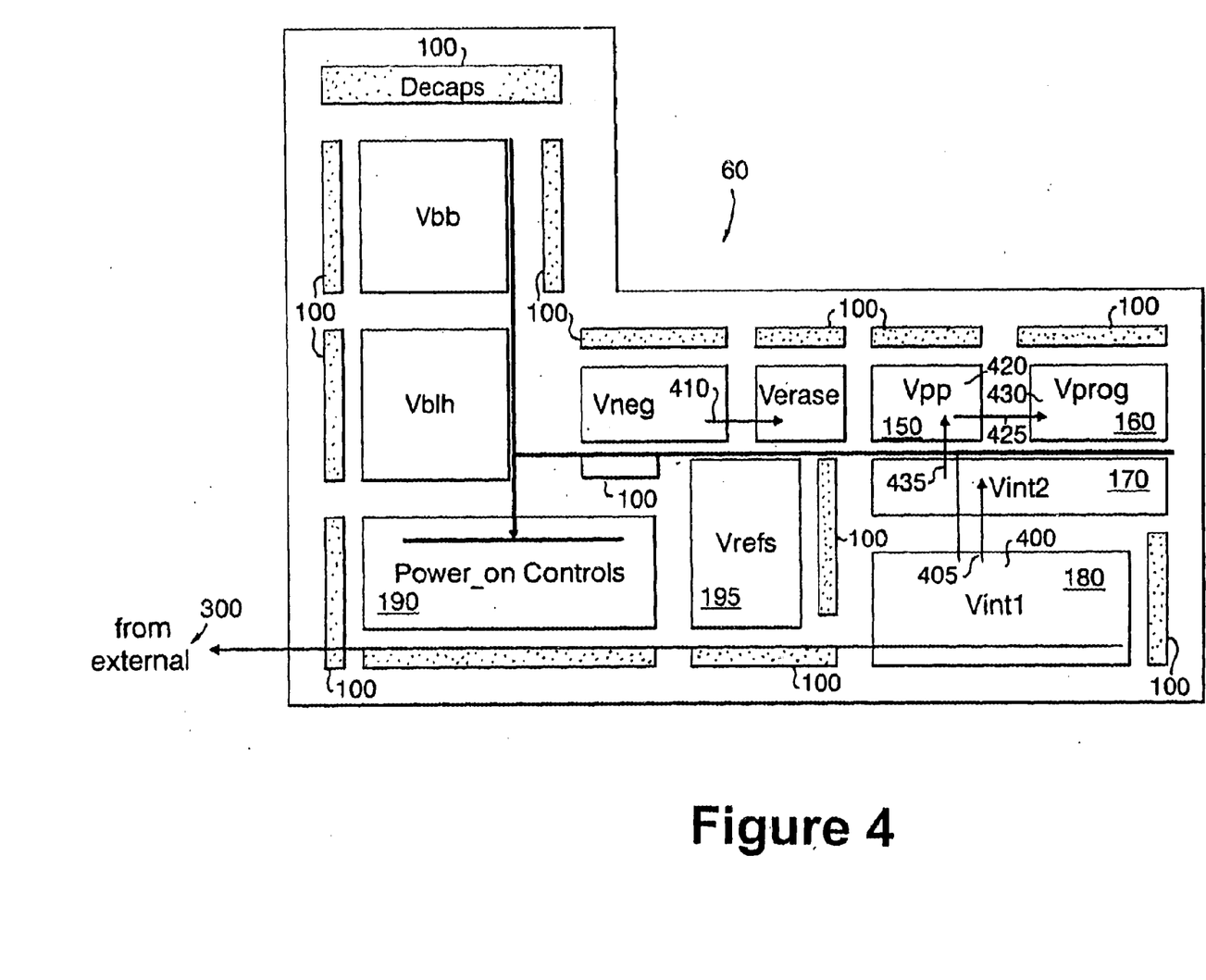
FIG. 4 illustrates the implementation of a cascaded pump in the centralized DC generator system 60 of the invention.

FIG. 4 illustrates the implementation of a cascaded pump in the centralized DC generator system 60 of the invention. As shown in FIG. 4, if a programming voltage 160 of the Flash memory requires 8V, then this may be supplied by the output 425 of the Vpp pump to generate Vprog 430. Similarly, voltage Vpp 150 maybe generated from an output 435 of the Vint2 (2.5V) 170, and Vint2 may be generated from the output 405 of the Vint1 400. Principles regarding design of the cascaded method is described in greater detail in commonly-owned, co-pending U.S. patent application Ser. No. 09/627,599 entitled "Low-Power DC Voltage Generator System", the contents and disclosure of which is incorporated by reference as if fully set forth herein. Particularly, the intermediate voltage level(s) afforded by a cascaded design have heretofore never been used in a centralized generator design. Similarly, as an erasure voltage of −7V is needed for the Flash memory to perform an erase operation, this voltage may be generated by the Vbb or Vneg (−0.5V). A GaAs RF device (not shown) that needs a bias of −4.5V, may be considered to receive an interim voltage level in a negative cascade chain.

Figure 7:
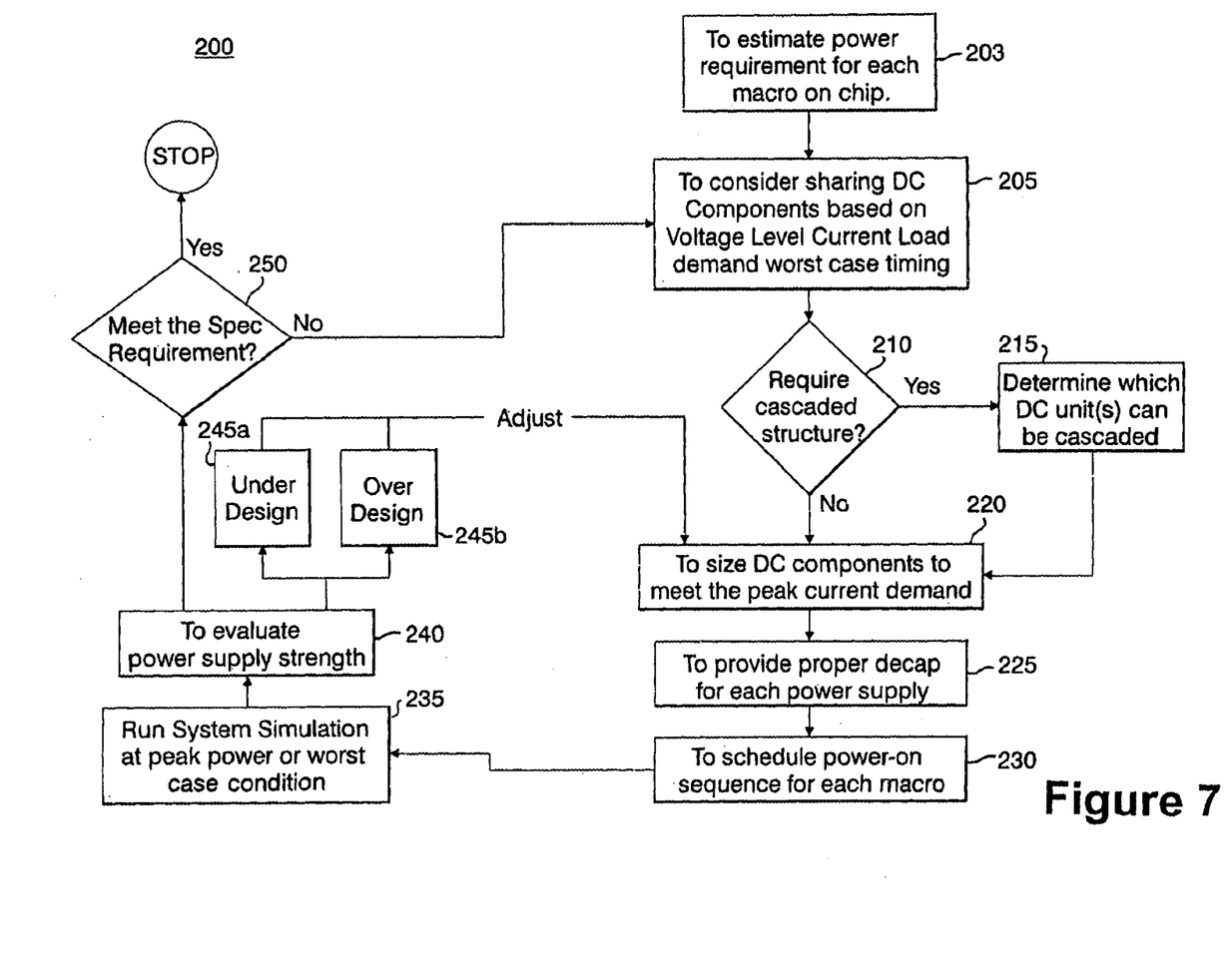
FIG. 7 illustrates a flow diagram depicting an integrated power system design sequence 200 according to the preferred embodiment of the invention.

On an SOC chip, it is the case that not all the macros operate simultaneously. For example, DRAM wordline operation (Vpp) only occurs during accessing DRAM for read/write array data. At the same time, it is unlikely the power from the same generator will be used for fuse, or Flash memory programming. If indeed, simultaneous current drawn from the same generator system do exist, then the worst-case design situation must be considered in the generator design. The multistage generator design is both power and area efficient and should be broadly implemented in the integrated SOC generator system; FIG. 7 illustrates a flow diagram depicting an integrated power system design sequence 200 according to the preferred embodiment of the invention. In the integrated power system design sequence 200 of FIG. 7, there is provided a first step 203 which requires an estimation of the power requirements for each macro on the SOC. The next design step 205 requires the consideration of sharing the DC generator components based on an analysis voltage levels, current load demands, and, worst case timing scenarios. Based on the analysis of step 205, a decision is made at step 210 as to whether the design requires a cascaded DC generator component structure. If the design does require a cascaded DC generator component structure, then a decision is made at step 215 to determine which DC units may be cascaded. Whether the DC units are to be cascaded or not, the process returns to step 220 to determine the size of the DC generator components that will meet estimated peak current demands. After the sizing requirements are determined, there is performed the step 225 of determining the proper decoupling capacitor component values for each DC generator. After the proper decoupling capacitor component values for each DC generator are determined, there is performed the step 230 of determining and scheduling the proper power-on sequence for each DC generator of the integrated power system. Then, at step 235, there is performed the step of running an integrated power system simulation to ascertain system performance at peak power or worst-case conditions. After the results of the simulation are evaluated at step 240, a determination is made at steps 245a, 245b to determine whether the system has been under- or over-designed, respectively. If the system has been either under- or over-designed, then the process loops back to step 220 to repeat system design steps 220–240 and make necessary adjustments to the DC generator sizes, decoupling capacitor values, etc. If however, at step 240, it is determined that the design is adequate with proper margin and sufficient redundancy, then a determination is made at step 250 to determine whether the designed integrated power system meet the specified requirements. If the design does not meet the specifications, then the process returns to step 205 to repeat system design steps 205–240. If however, the design meets specification, then the design process terminates.

Figure 5:
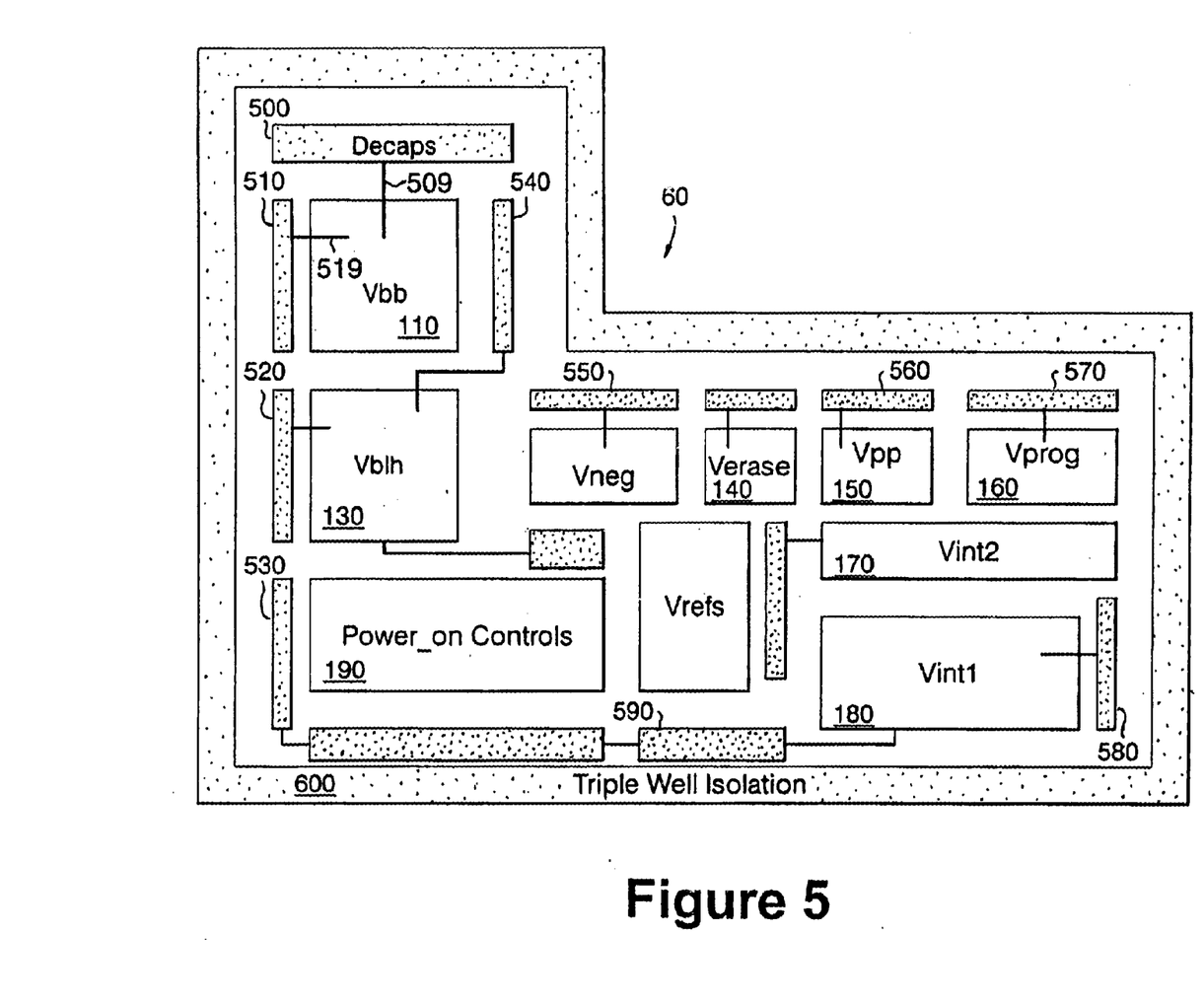
FIG. 5 illustrates the preferred embodiment of the centralized DC system 60 shown surrounded by a triple well structure 600.

The noise immunity afforded by the centralized DC power system 60 is much more satisfactory as that provided in a conventional distributed power design. That is, it is much easier to provide noise isolation to a designated area where all the DC components are closely located. As DC voltage generator components include oscillators, charge pumps and switch capacitors, a noisy environment is expected due to frequent switching activities, injecting charges to substrate and power supplies, etc. which are common in this area. Therefore, in the preferred embodiment, all of the DC power generator components are enclosed in an isolated structure. FIG. 5 illustrates the preferred embodiment of the centralized DC system 60 shown surrounded by a triple well structure 600. This triple well structure 600 is an isolated structure, where the body of the silicon is completely isolated by a surrounding n-well ring, and a buried n-well implanted layer. The n-well is biased by the highest voltage level. The negative voltage generators, such as Vbb, Vneg and Verase, are built inside the isolated n-wells. Each generator has its own designed and suitably sized decoupling capacitor to minimize any kind of noise disturbance. For example, decoupling capacitors ("decaps") 500, 510 are implemented for the Vbb generator 110, via lines 509, 519 respectively, decaps 540 and 520 are implemented for the Vblh, while decap 530, 580 and 590 are attached to the Vint 1, etc. In summary, it is easier for the integrated DC system to be manufactured inside isolated triple wells, with each supply furnished with sufficient of decoupling capacitors;

It is obvious that such an on-chip power has many advantages over the off-chip supply. For example, reduced IR drop on the supply voltages, quicker response time and thus less voltage ringing/rippling effect, power saving, etc. More importantly, no discrete power supplies are needed for each macro which means lower system cost, and better reliability. That is, the centralized Vint1 generator 180 1.8V generator provided in the SOC 9, when properly sized, will support all the macros. Thus extra redundant generator hardware may be eliminated.

Moreover, this results in increased array efficiency of memory macros which is defined as the ratio of memory array size over the total macro size. When the DC block is removed from DRAM and Flash memory macro according to the invention, the array efficiency naturally improves. This means that a customer may readily use the off-the-shelf memory macro thus, off-loading to the SOC designer the responsibility for providing the power supplies and customizing the central power supply macro. Furthermore, for the centralized power supply, the total number of generators is significantly reduced, therefore, the generator system of the SOC becomes easier to maintain, debug and repair. Besides, due to area saving, at least one backup unit may be provided for each major generator. If one fails, the backup unit can be used to continue to supply the voltage and current.

In summary, the centralized power system design provides design flexibility, power efficiency, area reduction, high noise immunity, and a reliable DC system. It is easy to maintain, also makes other macro design simpler. Combined with an intelligent BIST, the centralized power supply is the best power solution for low-power, low-cost and high-performance system on chip design.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A centralized power supply system for a multi-system on chip device comprising:
   an external power supply for supplying power to said device;
   a centralized DC generator macro having generator components for receiving said external power supplied and generating therefrom one or more power supply voltages for use by surrounding system macros provided on said multi-system on chip device, said centralized DC generator macro further distributing said generated power supply voltages to respective system macros; and
   noise blocking structure surrounding said centralized DC generator macro for isolating said centralized DC generator macro from said surrounding system macros, said noise blocking structure comprising a well structure including a body of semiconductor material isolated by a surrounding structure including a buried implanted layer of a conductivity different from said body of semiconductor material.

2. The centralized power supply system as claimed in claim 1, wherein said generator components of said centralized DC generator macro includes an associated decoupling capacitor for minimizing noise disturbances as generated by said generator components.

3. The centralized power supply system as claimed in claim 2, wherein a decoupling capacitor includes a deep-trench type capacitor.

4. The centralized power supply system as claimed in claim 3, wherein a decoupling capacitor includes a gate-oxide type capacitor.

5. The centralized power supply system as claimed in claim 1, whereby one or more surrounding system macros include a DRAM memory macro, said centralized DC generator macro including one or more generator components for powering up said DRAM memory macro, said DC generator macro thereby enabling memory array efficiency representing memory array size over a total macro size, to improve.

6. The centralized power supply system as claimed in claim 1, wherein said well structure is a triple well structure comprising a body of silicon completely isolated by a surrounding ring including said buried implanted layer of a conductivity different from said body.

7. The centralized power supply system as claimed in claim 1, wherein, for a multi-system power-on sequence, said generator components of said centralized DC generator macro are activated sequentially.

8. The centralized power supply system as claimed in claim 1, wherein one or more said generator components of said centralized DC generator macro are cascaded to provide greater voltage supply levels from components providing lower voltage levels.

9. The centralized power supply system as claimed in claim 8, wherein a high positive voltage power supply of said centralized DC generator macro is formed by a cascaded plurality of lower positive DC voltage generator components.

10. The centralized power supply system as claimed in claim 9, wherein said high positive voltage power supply includes one of: Vpp and Vprog and are generated based upon one or more lower Vint1 and Vint2 power supplies.

11. The centralized power supply system as claimed in claim 8, wherein a high negative voltage power supply of said centralized DC generator macro is formed by a cascaded plurality of lower negative DC voltage generator components.

12. The centralized power supply system as claimed in claim 11, wherein said high negative voltage power supply includes one or more of: Verase and Vref, and are generated based upon one or more lower Vbb and Vw1 power supplies used for powering DRAM circuit macro applications.

13. The centralized power supply system as claimed in claim 1, further including built-in-test circuit for checking and repairing said generator components of said centralized DC generator macro.

14. The centralized power supply system as claimed in claim 13, further including one or more redundancy units for backing up a faulty DC generator component of said centralized DC generator macro.

15. The centralized power supply system as claimed in claim 1, wherein a single DC generator component of said centralized DC generator macro generators power to be shared by one or more surrounding system macros.

16. A method for powering a centralized power supply system for a multi-system on chip device comprising an external power supply for supplying power to said device and, a centralized DC generator macro having generator components for receiving said external power supplied and generating therefrom one or more power supply voltages for use by surrounding system macros provided on said multi-system chip, said powering method comprising the steps of:

a) ramping up said external power supply to a target voltage level;

b) upon ramping to said target voltage level, activating one or more internal reference DC generator components of said centralized DC generator macro to ramp to predetermined reference voltage supply levels;

c) upon ramping to said predetermined reference voltage supply levels, activating secondary DC generator components of said centralized DC generator macro to predetermined target voltage supply levels; and, d) determining ramping to said predetermined target power levels and terminating said power-on sequence upon reaching said predetermined target voltage supply levels.

17. The method for powering a centralized power supply system as claimed in claim 16, the including implementing built-in-test circuitry for checking and repairing said DC generator components when corresponding predetermined reference and target power voltage supply levels are not reached.

18. A method for designing a centralized power supply system for a multi-system on chip device comprising the steps of:

a) estimating power supply requirements for each one or more system macros provided on said multi-system chip;

b) providing one or more DC generator components based on power supply requirements of said one or more system macros;

c) determining worst case current load demand for said system and determining size of DC generator components capable of meeting said worst case current load demand; and, d) determining placement and size of decoupling capacitors associated with each power supply DC generator component;

e) evaluate power supply operations by running a system simulation at worst case load conditions; and, f) determining if centralized power supply system meets performance criteria and, repeating steps c)–e) until satisfactory centralized power supply system performance criteria is met.

19. The method according to claim 18, wherein said step c) of determining worst case current load demand for said system includes determining if a cascaded DC power supply is required for powering up said one or more system macros.

* * * * *